Figure 1:
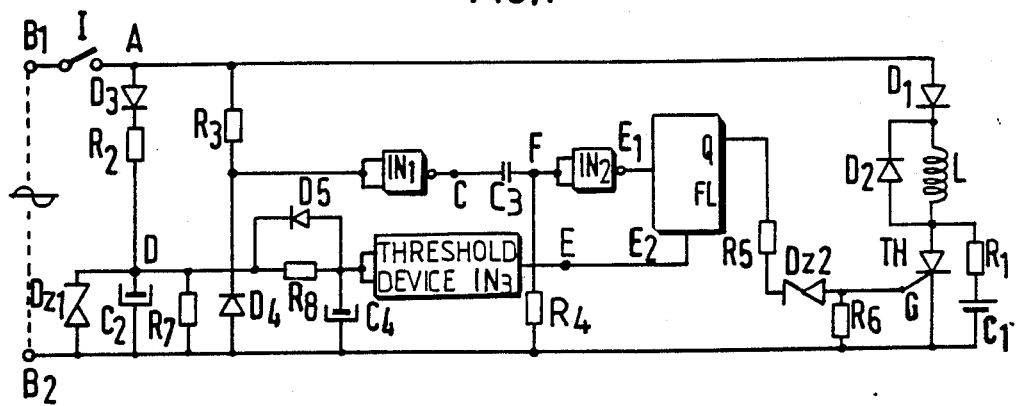

United States Patent [19]

Bataille et al.

[11] Patent Number: 4,933,806
[45] Date of Patent: Jun. 12, 1990

[54] METHOD AND DEVICE FOR CONTROLLING AN ELECTROMAGNET WHOSE ENERGIZATION, BY MEANS OF A MONOARCH PERIODIC CURRENT, CAUSES ACTUATION OF A MOBILE PART

[75] Inventors: Christian Bataille, Ville d'Avray; Elie Belbel, Epinay sur Seine; Jean-Noël Gast, Rueil Malmaison; Michel Lauraire, Courbevoie, all of France

[73] Assignee: La Telemecanique Electrique, France

[21] Appl. No.: 161,080

[22] PCT Filed: May 20, 1987

[86] PCT No.: PCT/FR87/00168

§ 371 Date: Jan. 19, 1988

§ 102(e) Date: Jan. 19, 1988

[87] PCT Pub. No.: WO87/07456

PCT Pub. Date: Dec. 3, 1987

[30] Foreign Application Priority Data

May 21, 1986 [FR] France .................. 86 07191

[51] Int. Cl.$^5$ .......................................... H01H 47/28
[52] U.S. Cl. ..................................... 361/153; 361/205
[58] Field of Search ............... 361/6, 187, 154, 205, 361/153, 3–5; 323/235, 319; 307/130

[56] References Cited

U.S. PATENT DOCUMENTS 3,329,837 7/1967 Hewie ............................ 307/262
3,668,422 6/1972 Pascente .......................... 361/6

Primary Examiner—L. T. Hix
Assistant Examiner—David M. Gray
Attorney, Agent, or Firm—William A. Drucker

[57] ABSTRACT

The invention provides a device for controlling an electromagnet having a coil (L) connected to a monoarch periodic current supply source, through a controllable switch (TH). This switch (TH) is controlled by a control circuit comprising a member for detecting the zero cross-over times of the voltage of the source (R$_3$, D$_4$, IN$_1$, R$_4$, C$_3$) and a switching device (FC) controlled by said detection member for delivering a closure signal to the switch (TH) following detection of a zero cross-over time which follows the order for controlling energization of the coil (L). The invention applies particularly to contactors and electromagnetic valves.

3 Claims, 1 Drawing Sheet

METHOD AND DEVICE FOR CONTROLLING AN ELECTROMAGNET WHOSE ENERGIZATION, BY MEANS OF A MONOARCH PERIODIC CURRENT, CAUSES ACTUATION OF A MOBILE PART

The present invention relates to a method and device for controlling an electromagnet whose energization, by means of a monoarch periodic current such as a rectified half wave current, causes actuation of a mobile part.

It applies more particularly to the control of electromagnets used in electric contactors were closure is caused following energization of the coil of the electromagnet by a periodic current of said type, such energization causing the mobile contacts of the contactor to be applied to the fixed contacts. However, the invention is not limited to this type of application. It may, in fact, be suitable for numerous other devices actuated by an electromagnet such for example, an electromagnetic valves.

In devices of this kind, the mechanical energy communicated to the mobile parts of the electromagnet for actuating the mobile part is variable depending on the closure angle of the switch which usually controls the energization of the coil of the electromagnet, that is to say depending on the time marking the beginning of the energization, considered in the corresponding period of the periodic current.

It has been observed, in particular, that this energy is maximum when the closure angle is zero and that it decreases as this angle increases in the fraction of the period considered containing an arch. It then follows, in certain devices, that if the electromagnet is not dimensioned for certain unfavorable angles, the desired actuation, for example the closure of the contactor, will not occur or else the mobile assembly will be stopped before total crushing of the contacts.

The purpose of the invention is then more particularly to reduce the dimensioning of such an electromagnet and the drawbacks which result therefrom, particularly in so far as the cost, size and energy saving is concerned.

To reach this result, the invention provides more particularly a method for controlling an electromagnet including a coil to which may be applied a monoarch periodic current coming from a source following the emission of a control order, for causing a given actuation of a mobile part, this method being more particularly characterized in that it includes, from the time when said control order has been emitted:

detection of the zero cross-over times from the increasing and/or decreasing values of the voltage of the source; and the application, at one of these times (or close thereto) of the periodic current to the coil of the electromagnet.

This method may be used by associating, with a controllable switch device in series with the coil of the electromagnet, a relatively simple electronic circuit comprising:

a member for determining the zero cross-over times from the positive and/or negative values of the voltage of the source; and a switching device controlled by said determining member for delivering a closure signal to the switch device when a zero cross-over time is detected following the control order for energizing the coil.

It is then clear that, with this method and this device, whatever the time when the control order is emitted, the energy communicated to the mobile part of the electromagnet will be optimum. The result is a decrease in the size and cost of the electromagnet.

Figure 2:
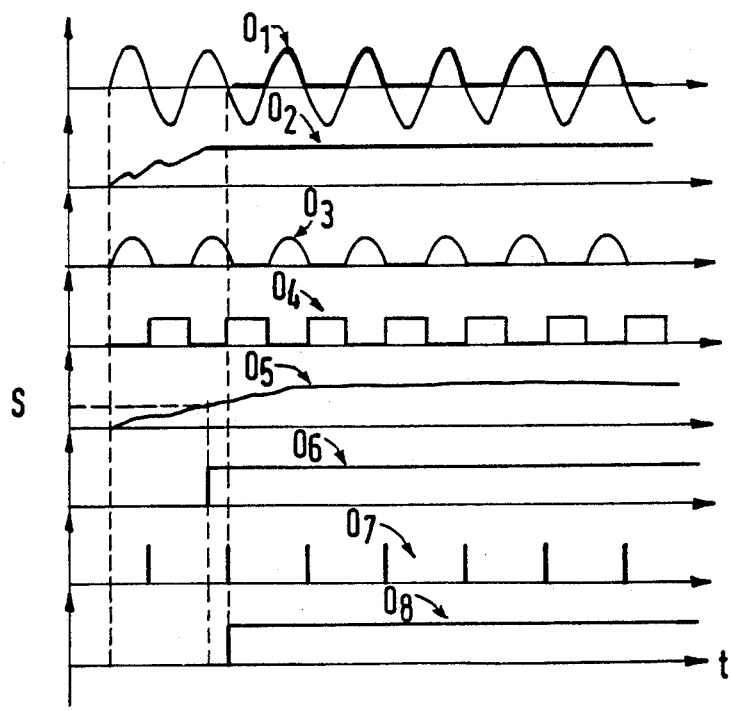

One embodiment of the invention will be described hereafter, by way of non limitative example, with reference to the accompanying drawings in which:

FIG. 1 is the general diagram of a control device in accordance with the invention; and FIG. 2 is a diagram representative of the electric signals at different points of the circuit shown in FIG. 1.

Such as shown in FIG. 1, the control device for an electromagnet of which only the coil L has been shown comprises, in series in a circuit connecting the coil L to the terminals of an AC source (terminals $B_1$, $B_2$), a control switch I whose closure is caused by application of an order for energizing the coil, a diode D1 providing half-wave rectification of the AC current and a controllable switch device formed by a thyristor TH shunted, in a conventional way, by a resistor $R_1$ in series with a capacitor $C_1$. In parallel with coil L there is also provided a free wheel diode $D_2$.

The gate G of the thyristor is controlled by an electronic control circuit fed by a supply circuit connected between the output terminal A of switch I and terminal $B_2$ of the source.

This supply circuit includes more particularly, in series, a diode $D_3$, a resistor $R_2$ and a capacitor $C_2$ shunted by a Zener diode $Dz_1$.

In this example, detection of the zeros of the voltage of the source downstream of switch I is obtained in accordance with a procedure including the following steps:

the provision of a half-wave rectified current synchronous with the AC current of the source and in phase therewith;

shaping of said rectified current into a square wave signal having the same frequency characteristics, but in phase opposition;

shunting of the square wave signal so as to obtain pulses corresponding to the rising fronts of said signal;

control of the gate G of the thyristor by means of a bistable flip-flop responsive to said pulses.

Thus, in the example shown, the phase for providing the rectified current is achieved by means of a rectifier circuit including, between the terminals A and $B_2$, a resistor $R_3$ and a diode $D_4$.

The oscillogram $O_3$ (FIG. 2) shows the rectified voltage obtained at point B, that is to say at the junction between resistor $R_3$ and diode $D_4$. This voltage has the same frequency and phase characteristics as the voltage between terminals A, and $B_2$ which is shown in oscillogram $O_1$ of FIG. 2 (thin lines plus thick lines).

The half wave rectified voltage obtained at point B is applied to a first inverting shaper $IN_1$ which delivers at a point C a synchronous square wave signal but in phase opposition, shown by the oscillogram $O_4$. This signal is then applied to a shunting device formed conventionally by a capacitor $C_3$ and a resistor $R_4$. At point F, situated at the junction of capacitor $C_3$ and resistor $R_4$, a succession of pulses is obtained which correspond respectively to the rising fronts of the square waves of the signal delivered by the inverting shaper IN1 and, consequently, to the zero cross-over from negative values of the half-wave rectified current delivered by diode $D_1$ (which is shown with thick lines in the oscillogram $O_1$).

These pulses, shown in the oscillogram $O_7$, are then applied to a second inverting shaper $IN_2$ whose output is connected to the input $E_1$ of a bistable flip-flop FL of type RS. The Q output of this flip-flop FL, whose signal is represented by the oscillogram $O_8$, is connected to the gate of thyristor TH through a circuit including resistor $R_5$ and a Zener diode $Dz_2$ in series. Furthermore, the gate of thyristor TH is connected to its cathode through the resistor $R_6$.

The initialization input $E_2$ of flip-flop FL is connected to an initialization circuit adapted so as to output an initialization signal only when, following the closure of switch I, the supply voltage exceeds a predetermined value. This initialization circuit includes more particularly, between point D of the supply circuit and terminal $B_2$, a resistor $R_8$ in series with a capacitor $C_4$. The junction point between this resistor $R_8$ and this capacitor $C_4$ is then connected to a threshold device $IN_3$ which delivers at its output E a voltage whose variation has been shown by the oscillogram $O_6$ and which comprises, following closure of switch I, a first phase during which the voltage has a zero value and a second phase which is initiated when the voltage at the input of the threshold device $IN_3$ (oscillogram $O_5$) reaches a given threshold S. During this second phase, the voltage at point E has a value corresponding to a logic state 1.

Thus, the initialization of flip flop FL is delayed, which avoids disturbances during the transitory phase which follows closure of switch I.

The above described circuit further comprises a diode $D_5$ in parallel with resistor $R_8$ for accelerating the discharge of capacitor $C_4$ at the time of opening of switch I.

Of course, the invention is not limited to a particular type of controllable switch for controlling the electromagnet. It is clear that the circuit including the thyristor TH and its control circuit could be replaced by any other circuit producing the same effects.

Thus, the control of the electromagnet could also be provided by means of an optocoupler having, in a way known per se, a light emitting diode mounted in the output circuit of flip flop FL and an optothyristor connected in the circuit of coil L.

We claim:

1. A device for energizing a coil of an electromagnet with a monoarch periodic current coming from a source, following the emission of a control order, wherein said coil is connected to an AC source through a first circuit comprising in series a control switch whose closure is caused by application of an order for energizing the coil, a diode ($D_1$) for obtaining the monoarch periodic current and a switching device (TH) which is controlled by means of a second circuit connecting an output of said control switch (I) to a control terminal (G) of the switching device (TH), said second circuit comprising:
   i. a rectifier means for delivering a half-wave rectified current synchronous with the AC current of the source and in phase therewith;
   ii. a shaper ($IN_1$) adapted for transforming the rectified current into a square-wave signal having the same frequency characteristics and in phase opposition;
   iii. a differentiating network mounted at an output of the shaper ($IN_1$) so as to obtain pulses corresponding to the rising fronts of said signal;
   iv. a bistable flip-flop (FL) responsive to said pulses and having an output connected to a control terminal of the switching device.

2. Device according to claim 1 which further comprises a circuit for initializing the bistable flip-flop, this circuit being connected to said first circuit downstream of said control switch (I), and including a rectifier circuit ($D_3$, $R_2$, $C_2$, $R_8$, $C_4$) which delivers a rectified signal and a threshold device ($IN_3$) which delivers an initialization signal to said bistable flip-flop (FL) when the rectified voltage exceeds a predetermined threshold, following closure of said control switch (I).

3. Device according to claim 1 wherein said switching device consists of a thyristor (TH) whose gate is controlled by an output circuit of the bistable flip-flop (FL).

* * * * *